United States Patent [19]

Frisbie

[11] Patent Number: 4,894,896
[45] Date of Patent: Jan. 23, 1990

[54] PRECISION CENTERING DEVICE

[75] Inventor: Milo W. Frisbie, Mesa, Ariz.

[73] Assignee: Motorola, Inc., Schaumburg, Del.

[21] Appl. No.: 273,764

[22] Filed: Nov. 21, 1988

[51] Int. Cl.[4] .............................................. B65G 47/00
[52] U.S. Cl. .................................... 29/33 P; 198/345;
269/254 CS; 269/266; 269/267; 279/79
[58] Field of Search ................ 279/15 G, 73 R, 23 A,
279/79; 409/219; 269/254 CS, 266, 267, 157;
29/563, 38.9, 759, 33 P; 198/345

[56] References Cited

FOREIGN PATENT DOCUMENTS

| 667398 | 10/1929 | France ................................ 269/266 |
| 163858 | 12/1980 | Japan ............................ 269/254 CS |
| 96213 | 10/1921 | Switzerland ........................ 269/266 |
| 1215974 | 3/1986 | U.S.S.R. ............................... 269/266 |

Primary Examiner—Daniel Howell
Attorney, Agent, or Firm—Joe E. Barbee

[57] ABSTRACT

Precision centering device useful for positioning items in a predetermined position has first and second halves which are held within a frame. The first and second halves are maintained against retaining walls within the frame by resilient material. The bottom portion of the halves extends from the bottom of the frame and each has a tapered edge which face each other in order to hold the item to be positioned. The top of the halves are maintained within the frame by a resilient structure which allows the halves to move in a vertical position. The halves which accomplish the positioning do not have to be made from precision parts. As the parts wear the centering precision is maintained since the parts are mirror images of each other made from a common piece of stock material.

8 Claims, 2 Drawing Sheets

U.S. Patent   Jan. 23, 1990   Sheet 1 of 2   4,894,896
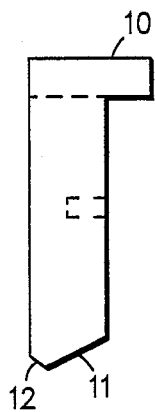
FIG. 1A
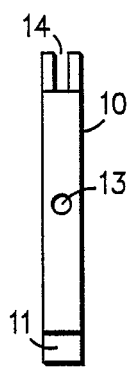
FIG. 1B
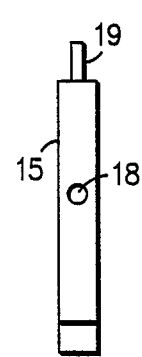
FIG. 2A
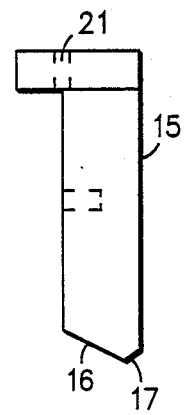
FIG. 2B
FIG. 3
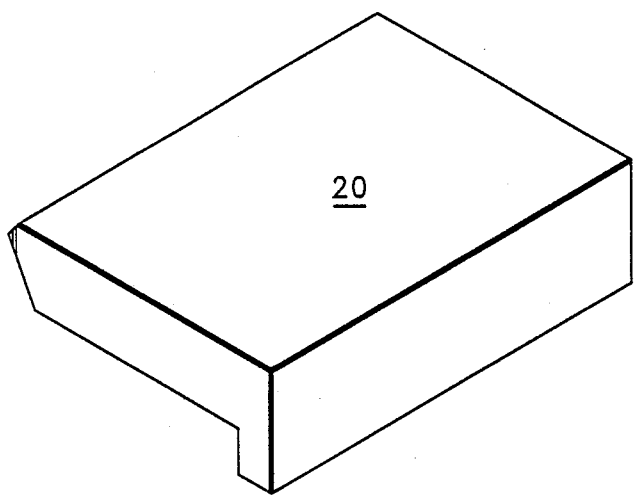

PRECISION CENTERING DEVICE

BACKGROUND OF THE INVENTION

This invention relates, in general, to centering mechanisms, and more particularly, to a precision centering device useful for centering work pieces.

With the automation of manufacturing assembly equipment it becomes essential that items being moved from one location to the other be precisely positioned in a predetermined location so that work may be performed upon them. This is particularly true in the semiconductor industry in the movement of semiconductor devices from one test location to another or from a marking location to a test location. Semiconductor devices are typically transported in a long plastic carrier commonly called a sleeve. The sleeve must be precisely located during the loading and unloading of the semiconductor devices to prevent binding and/or bending of leads of the semiconductor devices. Previously known centering devices were made and assembled in a manner that required very tight tolerances between the different components of the centering device pieces. The build up of tolerances often resulted in a centering device which would not provide precise centering. In addition, as a device was used wear on the device would result which would further contribute to the ability to not align precisely.

Accordingly, it is an object of the present invention to provide an improved and precise centering device.

Another object of the present invention is to provide a centering device which does not require tight manufacturing tolerances.

Yet another object of the present invention is to provide a precision centering device which maintains its precision even as the device itself wears from use.

Yet a further object of the present invention is to provide a device capable of absolute precision positioning using non-precision manufactured parts wherein wear does not affect the accuracy of positioning.

SUMMARY OF THE INVENTION

The above and other objects and advantages of the present invention are achieved through the use of a centering arrangement wherein the mechanism that makes contact with the item to be centered comprises a first and a second half. These halves are cut from a common piece of stock material. The halves each have a tapered bottom and a mating upper portion. The halves are held within a frame and as the item to be positioned passes beneath the frame the tapered bottoms move around the item and precisely center or position the item. The two halves are separated by resilient material which holds the halves up against the walls of the frame. The halves are held within the frame in a spring loaded manner which allows the item moving beneath the frame to move the halves upward until the item is between the tapered faces. As the items pass beneath the tapered halves the halves are forced downward by the spring loading.

BRIEF DESCRIPTION OF THE DRAWINGS

FIG. 1A is a front view of a first half of a component used in the present invention;
FIG. 1B is a side view of the first half;
FIG. 2A is a side view of a second half of a component of the present invention;
FIG. 2B is a front view of the second half;
FIG. 3 illustrates a common piece of stock material from which the first and second halves are cut.

DETAILED DESCRIPTION OF THE DRAWINGS

Figure 4:
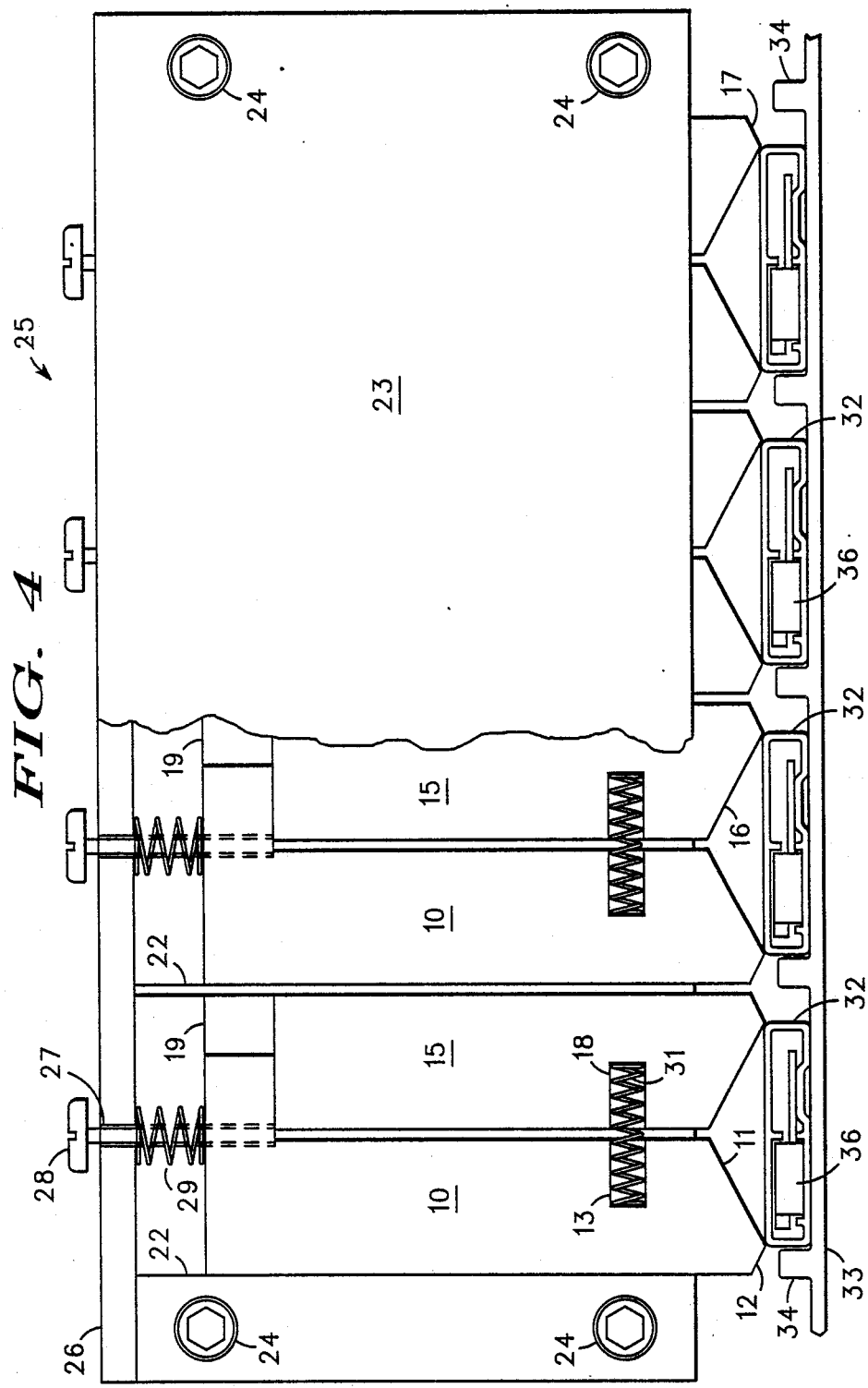
FIG. 4 illustrates the first and second halves assembled in a precision centering device of the present invention.

FIGS. 1A and 1B illustrate a first half of a structure used in the centering device of the present invention. FIG. 1A is a front view of structure 10. FIG. 1B is a side view of structure 10. Structure 10 looks like an inverted "L" having a tapered bottom. The bottom portion of structure 10 has a first tapered surface 11, and a second tapered surface 12. Tapered surface 12 is considerably shorter than tapered surface 11. A hole or recess 13 is made in the side of structure 10. The top of structure 10 has a slot 14 running the entire length of the top portion as illustrated in side view FIG. 1B.

A second half of a centering structure is illustrated as structure 15 in FIGS. 2A and 2B. The bottom portion of structure 15 is a mirror image of structure 10 shown in FIGS. 1A and 1B. Structure 15 has a hole 18 in its side which aligns with hole 13 of structure 10. It should be noted that holes 13 and 18 do not exceed the depth of structure 10 or 15 respectively. The top portion of structure 15 is different than the top structure of structure 10 in that structure 15 has material removed from both sides of the top in order to leave a ridge 19. Ridge 19 must be thin enough to slide into slot 14 so that the upper portions of structures 10 and 15 will mate or mesh with each other. Ridge 19 has a threaded hole 21. The bottom portion of structure 15 has a tapered edge 16 and a shorter tapered edge 17. The assembly and mating of structures 10 and 15 will become apparent hereinafter.

FIG. 3 illustrates a common piece of stock material 20 having the general configuration of a side view of structure 10 or structure 15. In fact, structure 10 and structure 15 are cut from machined stock material 20. It is important that structures 10 and 15 be cut from the same configured stock material in order to eliminate tolerance differences or variations. If structure 10 were machined from a different piece of material than structure 15 the machining tolerances required would be difficult to maintain. Depending upon the length of stock material 20 several pairs of structures 10, 15 can be cut from one common piece of stock material 20. Stock material 20 can be any suitable low friction material such as a plastic bearing material, brass, or the like.

FIG. 4 illustrates structures 10 and 15 assembled in centering device 25 and in the process of centering a workpiece or item 32. Item 32 is illustrated as being a semiconductor chip carrier sleeve which contains a plurality of semiconductor packaged devices 36. It will be understood that precision centering device 25 is capable of centering items other than those illustrated. Precision centering device 25 could even be used to center circular objects as well as the irregular shaped object illustrated. Precision centering device 25 has a top 26, a side 23 and partitions 22. Side 23 is shown partially cut away in order to illustrate the arrangement of structures 10 and 15 within the frame provided by device 25. Note that the bottom portion of the frame is open so that the tapered ends of structures 10 and 15 protrude through the open bottom.

The embodiment illustrated in FIG. 4 shows four separate centering positions or stations. It will be understood that the present invention can be used in a single centering station or a plurality of centering stations, as illustrated. Each centering station includes separate structures 10 and 15. Item 32 which is being centered or positioned in a predetermined position is moved to each station by a conveyor belt arrangement 33 which has paddles 34. Paddles 34 engage items 32 and push or place items 32 in the general vicinity of the predetermined position. Structures 10 and 15 then move down on item 32 to place item 32 in the desired position. If conveyor belt 33 moves to the right tapered edge 12 will engage item 32 and rise up to allow item 32 to be captured between tapered edges 11 and 16. Should conveyor belt 33 move to the left, then tapered edge 17 of structure 15 will be nudged up by item 32 so that item 32 may then be centered by tapered edges 11 and 16. If structure or half 10 is pushed upward, half 15 will also rise since ridge 19 is mated into slot 14. If half 15 is pushed upward, half 10 will also rise since ridge 19 is narrow and the portion of half 10 enclosing slot 14 rests on the shoulder formed by narrow ridge 19 and the body of half 15.

The frame of precision centering device 25 is illustrated as having cover 23 attached by bolts 24. Top 26 of the frame has an opening 27 for the passage of a retaining mechanism 28 illustrated as a screw. Retaining mechanism 28 passes through opening 27 and through a spring 29 and engages structure 15 through threaded hole 21 (illustrated in FIG. 2B). Threaded hole 21 is located in ridge 19. Spring 29 can be any resilient material which maintains structures 10 and 15 in a downward position until an item to be precisely positioned pushes up on structures 10 and 15 which then compresses resilient material 29 and causes the head of screw 28 to rise above top 26. Structures 10 and 15 also have a spring 31 positioned in openings 13 and 18 in order to maintain structures 10 and 15 apart from each other. The frame of precision centering device 25 has partitions 22 which retain structures 10 and 15 in order to maintain spring 31 in compression. Spring 31 can be any suitable resilient material which keeps structures 10 and 15 against partitions 22.

Cutting or slicing structures 10 and 15 from the same stock material gives tapered edges 11 and 16 the same taper. These structures do not have to be made to close tolerances since they are mirror images of each other, and since resilient material 31 pushes the halves apart from each other close tolerances across the face of the structure 10 or 15 do not have to be maintained. In a preferred embodiment, the essential feature of the stock material is that it be a low friction material so that it can slide easily in a vertical direction within partitions or retaining walls 22. The precision centering feature is maintained even as structures 10 and 15 wear since they both wear evenly. No clearance is needed between structures 10 and 15 and retaining walls 22 because spring 31 holds the structure halves in place thereby resulting in zero horizontal motion for tapered edges 11 and 16. Accordingly, it should be appreciated that a precision centering device has been provided which can be used in any application that requires absolute location of an item. The precision centering device provides absolute precision positioning from non-precision parts and the wear of the parts does not affect positioning accuracy.

I claim:

1. A precision centering device for holding items in a predetermined position, comprising: a first portion and a second portion each having a tapered bottom end and a mating top end; a frame for receiving the first and second portions, the frame having an opening to allow the tapered bottom end of the first and second portions to extend therefrom and having a screw receiving hole opposite from the opening; a first spring means positioned between the first and second portions; a second spring means positioned between the top ends of the first and second portions and the screw receiving hole; and a screw positioned through the screw receiving hole and the second spring means and engaging the first portion.

2. The precision centering device of claim 1 wherein the first and second portions each have a recess for receiving the first spring means.

3. A device for positioning an item in a predetermined position comprising: a first half of a centering portion and a second half of a centering portion, each first and second half having a tapered end and mating opposite ends so that the first half will be lifted by the second half when the second half rises; a frame for holding the first and second halves and having an opening to allow the tapered ends to protrude; first resilient means located between the first and the second half; second resilient means positioned between the frame and the first and second halves; and retaining means for retaining the second half in the frame and allowing the second half to move in response to the second resilient means.

4. The device of claim 3 wherein the tapered ends form an item receiving area, and the first and second resilient means are springs.

5. The device of claim 3 wherein the frame provides enclosures for a plurality of first and second half pairs.

6. The device of claim 3 wherein the first and second halves are cut from a common piece of stock material.

7. A precision centering device comprising a frame; at least two halves which have bottom portions having mirror images of each other, the bottom portions having tapered edges for engaging an item to be centered, and the at least two halves being held by the frame; first resilient means for holding the two halves apart from each other and in contact with the frame; and second resilient means located between the frame and the portions of the two halves opposite the bottom portions for allowing motion of the at least two halves within the frame.

8. The precision centering device of claim 7 wherein the first and second resilient means are springs and the tapered edges of the at least two halves extend from the frame in order to engage the item to be centered.

* * * * *